United States Patent
Park et al.

(10) Patent No.: US 7,084,072 B2
(45) Date of Patent: Aug. 1, 2006

(54) METHOD OF MANUFACTURING SEMICONDUCTOR DEVICE

(75) Inventors: Cheol Hwan Park, Seoul (KR); Sang Ho Woo, Kyoungki-do (KR); Chang Rock Song, Kyoungki-do (KR); Dong Su Park, Kyoungki-do (KR); Tae Hyeok Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 126 days.

(21) Appl. No.: 10/874,983

(22) Filed: Jun. 23, 2004

(65) Prior Publication Data

US 2005/0095868 A1    May 5, 2005

(30) Foreign Application Priority Data

Oct. 31, 2003  (KR) ..................... 10-2003-0076582

(51) Int. Cl.
    *H01L 21/302*  (2006.01)
(52) U.S. Cl. .................. 438/723; 216/74; 216/79; 216/83; 216/96; 216/99; 438/703; 438/704; 438/724; 438/744; 438/756
(58) Field of Classification Search ............. 438/8, 438/689; 216/74, 83
    See application file for complete search history.

(56) References Cited

FOREIGN PATENT DOCUMENTS

KR            100252039          5/1999

OTHER PUBLICATIONS

S.Wolf and R.N.Tauber, Silicon Processing for the VLSI Era, vol. 1, Lattice Press (1986) pp. 169 210, 230, 192-194, 532-534.*
Y.-S. Lin et.al. Journal of Applied Physics, vol. 93, No. 10, pp. 5945-5952, (2003).*

* cited by examiner

*Primary Examiner*—Nadine G. Norton
*Assistant Examiner*—Maki Angadi
(74) *Attorney, Agent, or Firm*—Ladas & Parry LLP

(57) ABSTRACT

Disclosed is a method of manufacturing a semiconductor device. The method includes the steps of forming a gate in a cell region and a peripheral region of a substrate, depositing a buffer oxide layer on the gate and the substrate, annealing a resultant structure of the substrate, depositing a nitride spacer layer on the buffer oxide layer, depositing an oxide spacer layer on the nitride spacer layer, forming an oxide spacer at the peripheral region of the substrate, and removing the oxide spacer layer remaining in the cell region. The annealing step is additionally carried out after depositing the buffer oxide layer so as to improve the interfacial surface characteristic and film quality, so that oxide etchant is prevented from penetrating into the silicon substrate during the wet dip process. Unnecessary voids are prevented from being created in the silicon substrate.

6 Claims, 3 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device capable of preventing voids from being created in a silicon substrate caused by oxide etchant penetrating into the silicon substrate.

2. Description of the Prior Art

Various kinds of silicon nitride layers (hereinafter, simply referred to as nitride layers) are used for manufacturing semiconductor devices. For example, when manufacturing a DRAM, a silicon oxide layer is formed as a buffer oxide layer through a CVD (chemical mechanical deposition) process after performing a gate etching process in order to improve device characteristics. After that, a nitride spacer in the form of a nitride layer is fabricated. Even though a space between gates becomes narrow, a spacer must be deposited with a thin thickness and a superior step-coverage characteristic while allowing gates to have insulation characteristics with respect to each other. Accordingly, the nitride layer is used for the spacer because the nitride layer has superior step-coverage and insulation characteristics as compared with an oxide layer.

In addition, the nitride spacer is used as a barrier when a dopant ion implantation process is carried out so as to improve junction and transistor characteristics. Moreover, the nitride spacer is used as a barrier when an etching process is carried out in order to prevent SAC fail between a gate and a bit line and between a gate and a capacitor, thereby improving reliability and a yield rate of semiconductor devices.

However, since the nitride spacer has inferior film quality, if a buffer oxide layer and a nitride spacer are sequentially formed after the gate etching process has been carried out, the nitride spacer does not sufficiently function as a barrier against oxide etchant when a wet dip process is carried out for an oxide spacer in the form of an oxide layer, so the buffer oxide layer may be partially etched. As a result, a silicon substrate, which is attacked by wet chemical when the dopant ion implantation process and the gate etching process are carried out, is damaged by oxide etchant. Accordingly, as shown in FIG. 1, a void having a depth above 1 μm is created in the silicon substrate.

Herein, the silicon substrate may be damaged because a silicon lattice is damaged due to high-energy ion implantation or due to dopants excessively distributed over the whole area of a surface of the silicon substrate when a surface channel is formed. In addition, after the silicon lattice damage has been created, a damage overlap may occur in the silicon substrate because the silicon substrate is further damaged by etchant when the gate etching process is carried out or the silicon substrate is locally weakened due to an attack of wet chemical after the gate etching process has been carried out.

The void created in the silicon substrate is exposed when a landing plug contact is formed so that polysilicon for a plug is deposited in the void. In this case, a junction to a gate, a well, and an electric circuit-short between bit lines may be caused, so that junction leakage current, which is fatal to the semiconductor device, is increased. As a result, row and column fail is created, deteriorating device characteristics and a yield rate of the semiconductor device.

SUMMARY OF THE INVENTION

Accordingly, the present invention has been made to solve the above-mentioned problems occurring in the prior art, and an object of the present invention is to provide a method of manufacturing a semiconductor device capable of preventing voids from being created in a silicon substrate caused by oxide etchant penetrating into the silicon substrate.

Another object of the present invention is to provide a method of manufacturing a semiconductor device capable of improving device characteristics and a yield rate of the semiconductor device by preventing voids from being created in a silicon substrate.

In order to accomplish the object, there is provided a method of manufacturing a semiconductor device, the method comprising the steps of: forming a gate in a cell region and a peripheral region formed on a silicon substrate, respectively; depositing a buffer oxide layer on the gate and the silicon substrate; annealing a resultant structure of the silicon substrate by using $NH_3$ in such a manner that the buffer oxide layer is nitrified while forming a nitride layer thereon, and diffusing nitrogen into the buffer oxide layer such that a oxynitride layer is formed in the buffer oxide layer, thereby enhancing an interfacial surface characteristic between the buffer oxide layer and the silicon substrate; depositing a nitride spacer layer on the buffer oxide layer; depositing an oxide spacer layer on the nitride spacer layer; forming an oxide spacer at the peripheral region of the silicon substrate by etching an entire surface of the oxide spacer layer while masking the cell region of the silicon substrate; and removing the oxide spacer layer remaining in the cell region through a wet dip process by using the nitride spacer layer as an etch barrier while masking the peripheral region of the silicon substrate.

According to the preferred embodiment of the present invention, the $NH_3$ annealing step is carried out by using one selected from the group consisting of a plasma process, a furnace process, and a rapid thermal annealing process in a process chamber, in which a deposition process for the buffer oxide layer is carried out, in situ, at a temperature of about 600 to 900° C. with pressure of about 5 mTorr to 200 Torr.

The deposition process for the nitride spacer layer is carried out in an LPCVD chamber having a temperature of about 600 to 900° C. and pressure of about 0.1 to 10 Torr by using one of $SiH_4$, $SiCl_4$ and $SiH_2Cl_2$ gas as silicon source gas and one of $NH_3$ and $N_2$ gas as nitrogen source gas. A ratio of nitrogen source gas to silicon source gas is about 1:1 to 20:1 when depositing the nitride spacer layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
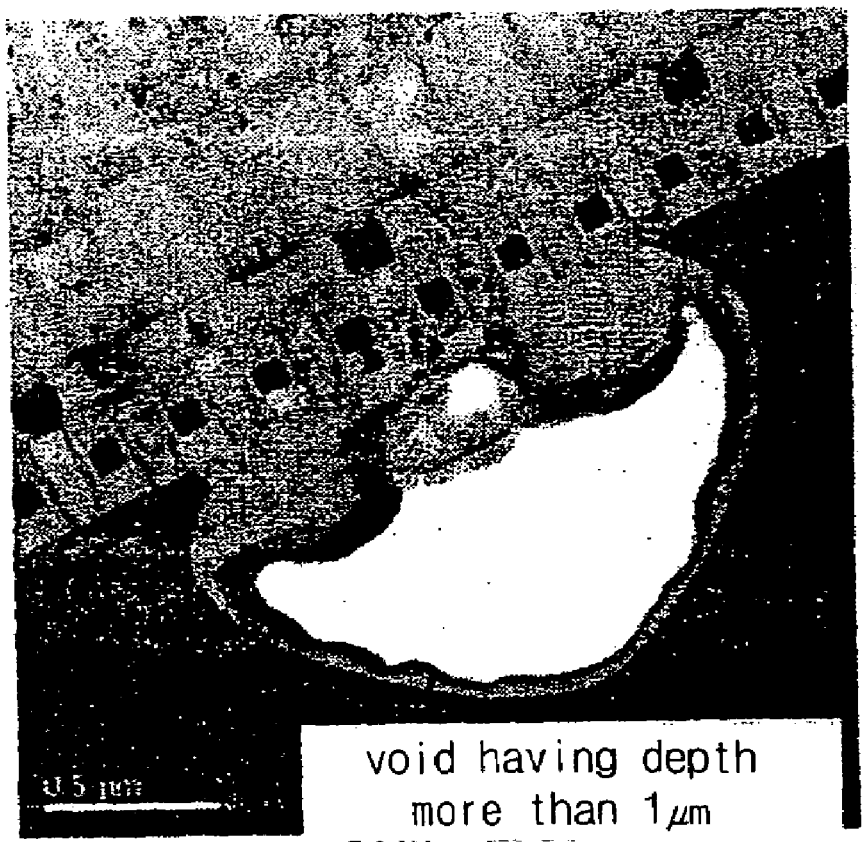
FIG. 1 is a photographic view showing a silicon substrate having a void created by oxide etchant penetrating into the silicon substrate.

Hereinafter, a preferred embodiment of the present invention will be described with reference to the accompanying drawings. In the following description and drawings, the same reference numerals are used to designate the same or similar components, and so repetition of the description on the same or similar components will be omitted.

Firstly, a technical principle of the present invention will be described below.

When a buffer oxide layer and a nitride spacer are sequentially formed after a gate etching process has been carried out in order to improve device characteristics of a semiconductor device, an interfacial surface characteristic between the buffer oxide layer and the nitride spacer is deteriorated so that the nitride spacer does not sufficiently function as a barrier when a wet dip process is carried out for an oxide spacer. As a result, the buffer oxide layer is partially etched and oxide etchant penetrates into a silicon substrate so that a void is formed in the silicon substrate. Thus, device characteristics may be deteriorated while also decreasing a yield rate of the semiconductor device.

Therefore, the present invention improves the interfacial surface characteristics between the buffer oxide layer and the nitride spacer such that film quality of the nitride spacer can be improved. Accordingly, the nitride spacer may sufficiently function as a barrier when an etching process is carried out and the buffer oxide layer has superior endurance against general oxide etchant.

Since the nitride spacer sufficiently functions as a barrier and the buffer oxide layer has a superior etch-resistant property against general oxide etchant, not only is oxide etchant prevented from penetrating into the silicon substrate through the nitride spacer, but also the buffer oxide layer is prevented from being etched. Accordingly, since oxide etchant does not penetrate into the silicon substrate, a void is prevented from being created in the silicon substrate.

To this end, according to the present invention, a surface of the buffer oxide layer is nitrified by means of $NH_3$ after the buffer oxide layer has been deposited and before the nitride spacer is deposited. In this case, the interfacial surface characteristic of the buffer oxide layer is improved so that a micro pinhole may be prevented from being created in a nitride layer when the nitride layer is deposited. Accordingly, the nitride spacer has a tight film structure. In addition, when the $NH_3$-treatment process is carried out, nitrogen is diffused into the buffer oxide layer so that an oxynitride layer is formed in the buffer oxide layer. The buffer oxide layer including the oxynitride layer has a superior etch-resistant property against general oxide etchant. In addition, nitrogen and hydrogen diffused through the buffer oxide layer when the $NH_3$-treatment process is carried out are deposited on an interfacial surface between the silicon substrate and the buffer oxide layer and bonded to a silicon dangling bond, so an interfacial surface characteristic between the silicon substrate and the buffer oxide layer can be improved.

FIGS. 2a to 2d are sectional views for explaining a method of manufacturing a semiconductor device according to one embodiment of the present invention. Hereinafter, the method of manufacturing the semiconductor device according to one embodiment of the present invention will be described in detail with reference to FIGS. 2a to 2d.

Figure 2A:
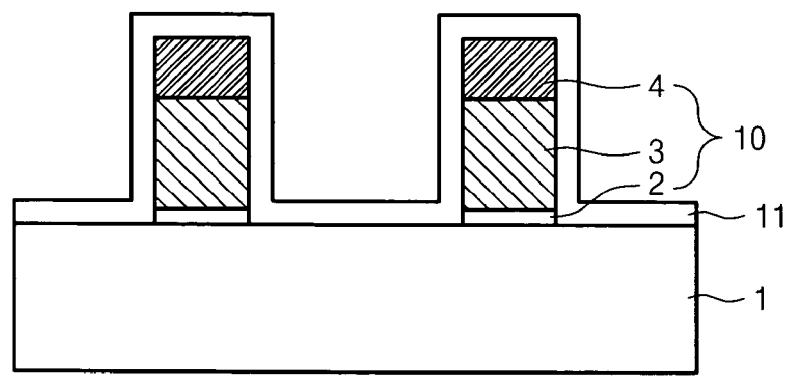
FIGS. 2a to 2d are sectional views for explaining a method of manufacturing a semiconductor device according to one embodiment of the present invention.

Referring to FIG. 2a, a gate oxide layer 2, a gate conductive layer 3 in the form of a stacked layer of polysilicon and tungsten or tungsten silicide, and a nitride hard mask 4 are sequentially formed on a silicon substrate 1 having a cell region and a peripheral region. After that, the nitride hard mask 4, the gate conductive layer 3 and the gate oxide layer 2 are etched, thereby forming gates 10 in the cell region and the peripheral region of the silicon substrate 1. Then, in order to compensate for a damage created in the silicon substrate 1 during a gate etching process, a gate re-oxidation process is carried out.

Thereafter, a buffer oxide layer 11 is deposited on the gates 10 and the silicon substrate 1 through a CVD process.

Figure 2B:
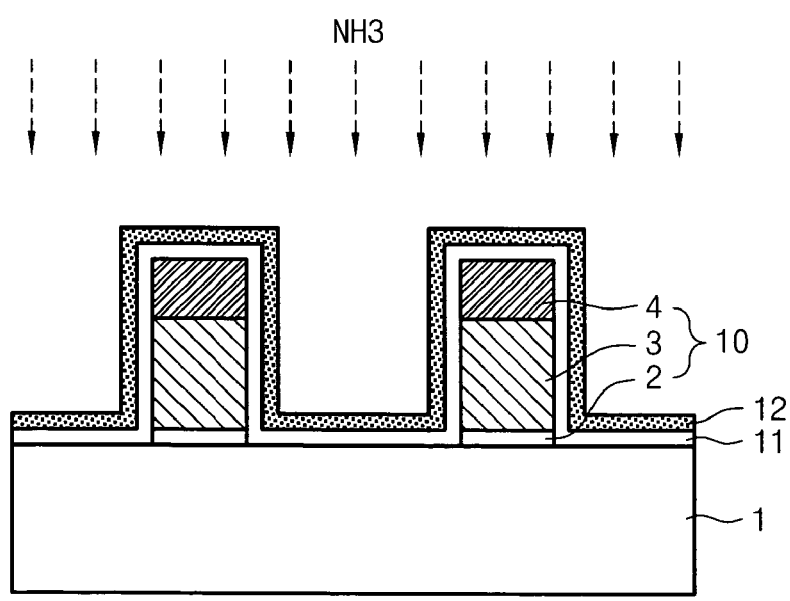

Referring to FIG. 2b, $NH_3$-annealing is carried with respect to a resultant structure of the semiconductor substrate for a long period of time. At this time, such $NH_3$-annealing is carried out by means of plasma, a furnace, or rapid thermal annealing. In addition, such $NH_3$-annealing is carried out in-situ in a process chamber, which is used for depositing the buffer oxide layer, at a temperature of about 600 to 900° C. and pressure of about 5 mTorr to 300 Torr.

Herein, if such $NH_3$-annealing is carried out for a long period of time, a surface of the buffer oxide layer 11 is nitrified so that a nitride layer 12 is formed. Accordingly, a tight nitride spacer having no pinholes may be deposited because an interfacial surface characteristic of the buffer oxide layer 11 has been improved.

In addition, if such $NH_3$-annealing is carried out for a long period of time, nitrogen is diffused into the buffer oxide layer 11 so that an oxynitride layer (not shown) is formed in the buffer oxide layer 11. Since the oxynitride layer is not etched by general oxide etchant, the buffer oxide layer 11 has film quality identical to or superior than that of a thermal oxide layer while obtaining a superior etch-resistant property against general oxide etchant.

Moreover, if such $NH_3$-annealing is carried out for a long period of time, nitrogen and hydrogen are diffused through the buffer oxide layer 11 and bonded to a silicon dangling bond of an interfacial surface formed between the buffer oxide layer 11 and the silicon substrate 1. Accordingly, a reinforced interfacial surface, which is rarely dissolved by oxide etchant during a wet dip process, can be realized between the buffer oxide layer 11 and the silicon substrate 1.

Therefore, when such $NH_3$-annealing is carried out before the nitride spacer is deposited, the interfacial surface characteristic may be reinforced and the buffer oxide layer 11 has superior film quality having superior endurance against oxide etchant, so interfacial surface stress can be attenuated among the silicon substrate 1, the buffer oxide layer 11, and the nitride spacer. Accordingly, when the wet dip process is carried out for an oxide layer, micro-cracks and lifting can be suppressed so that the void is prevented from being created in the silicon substrate. As a result, the device characteristics and yield rate of the semiconductor device can be improved.

Preferably, high-temperature vacuum annealing is carried out before or after such $NH_3$-annealing in order to further improve tightness of the buffer oxide layer 11.

Figure 2C:
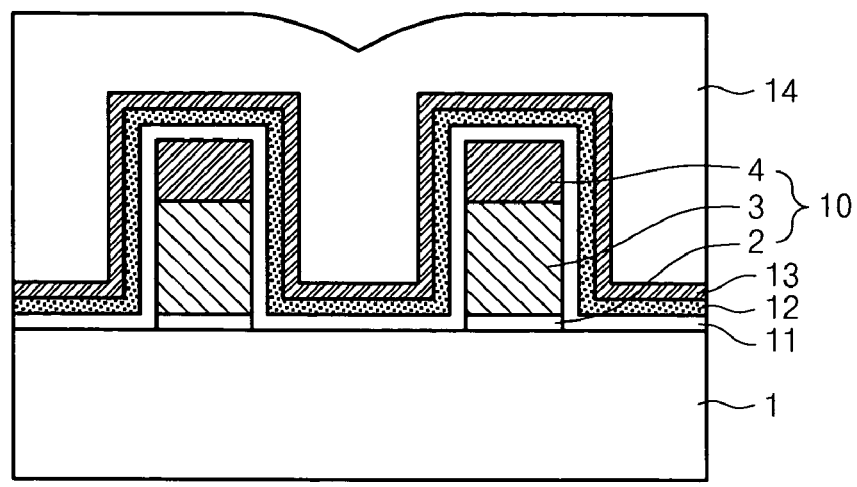

Referring to FIG. 2c, after such $NH_3$-annealing has been carried out with respect to the buffer oxide layer 11 for a long period of time, the nitride spacer 13 is deposited on the buffer oxide layer 11 in an LPCVD chamber having a temperature of about 600 to 900° C. and pressure of about 0.1 to 10 Torr. At this time, $SiH_4$, $SiCl_4$ or $SiH_2Cl_2$ gas is used as silicon source gas and $NH_3$ or $N_2$ gas is used as nitrogen source gas. A ratio of nitrogen source gas to silicon source gas is about 1:1 to 20:1 ($NH_3$:$SiH_4$). A predetermined amount (a few sccm to a few slm) of such nitrogen source gas and silicon source gas is supplied into the LPCVD chamber through a mass flow controller (MFC) so as to induce a surface chemical reaction on the silicon substrate for depositing the nitride spacer 13 on the silicon substrate.

Then, the oxide spacer 14 is deposited on the nitride spacer 13 in order to form a gate spacer in the peripheral region of the silicon substrate.

Figure 2D:
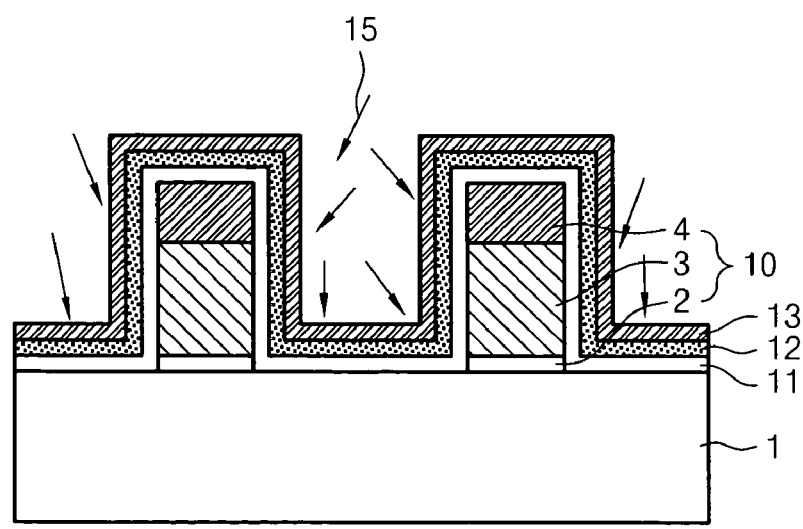

Referring to FIG. 2d, after forming a first mask (not shown) masking the cell region of the silicon substrate such that only the peripheral region of the silicon substrate is exposed, the oxide layer formed at the exposed peripheral region of the silicon substrate is entirely etched, thereby forming the oxide spacer (not shown in FIG. 2d) in the peripheral region of the silicon substrate.

Next, after removing the first mask, a second mask (not shown) masking the peripheral region of the silicon substrate is formed in order to expose only the cell region of the silicon substrate. Then, the oxide spacer formed in the exposed cell region of the silicon substrate is removed through the wet dip process by using oxide etchant 15.

At this time, as mentioned above, the nitride spacer 13 has superior film quality so it functions as a barrier when the wet dip process is carried out. In addition, since the buffer oxide layer 11 has a superior etch-resistant property against oxide etchant, the buffer oxide layer 11 is not etched by oxide etchant. Accordingly, oxide etchant does not penetrate into the silicon substrate so that the void is prevented from being created in the silicon substrate.

According to the present invention, $NH_3$-annealing is additionally carried out after depositing the buffer oxide layer on the silicon substrate, thereby attenuating stress generated from interfacial surfaces of the silicon substrate, the buffer oxide layer and nitride spacer. Thus, the microcrack and the lifting, which are created during the wet dip process because the oxide spacer is etched within a short period of time with a high etch rate, can be restrained. Therefore, the void is prevented from being created in the silicon substrate, so that fails derived from the void can be prevented. Thus, the device characteristics and yield rate of the semiconductor device can be improved.

Even thought they are not illustrated, next processes including an insulating interlayer forming process, a landing plug contact forming process, and a landing plug poly forming process are carried out after the second mask for masking the peripheral region of the silicon substrate has been removed, thereby fabricating the semiconductor device.

As described above, according to the method of manufacturing the semiconductor device of the present invention, when the buffer oxide layer and the nitride spacer are sequentially formed after the gate etching process has been carried out in order to improve the device characteristics of the semiconductor device, the $NH_3$ annealing process is additionally carried out after depositing the buffer oxide layer so as to improve the interfacial surface characteristic and film quality, so that oxide etchant is prevented from penetrating into the silicon substrate during the wet dip process. Accordingly, unnecessary voids are prevented from being created in the silicon substrate caused by oxide etchant, thereby improving the device characteristics and yield rate of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising the steps of:
   i) forming a gate in a cell region and a peripheral region formed on a silicon substrate, respectively;
   ii) depositing a buffer oxide layer on the gate and the silicon substrate;
   iii) annealing a resultant structure of the silicon substrate by using $NH_3$ in such a manner that the buffer oxide layer is nitrified while forming a nitride layer thereon, and diffusing nitrogen into the buffer oxide layer such that a oxynitride layer is formed in the buffer oxide layer, thereby enhancing an interfacial surface characteristic between the buffer oxide layer and the silicon substrate;
   iv) depositing a nitride spacer layer on the buffer oxide layer;
   v) depositing an oxide spacer layer on the nitride spacer layer;
   vi) forming an oxide spacer at the peripheral region of the silicon substrate by etching an entire surface of the oxide spacer layer while masking the cell region of the silicon substrate; and
   vii) removing the oxide spacer layer remaining in the cell region through a wet dip process by using the nitride spacer layer as an etch barrier while masking the peripheral region of the silicon substrate.

2. The method as claimed in claim 1, wherein the $NH_3$ annealing step is carried out by using one selected from the group consisting of a plasma process, a furnace process, and a rapid thermal annealing process.

3. The method as claimed in claim 1, wherein the $NH_3$ annealing step is carried out in a process chamber, in which a deposition process for the buffer oxide layer is carried out, in situ.

4. The method as claimed in claim 3, wherein the $NH_3$ annealing step is carried out at a temperature of about 600 to 900° C. with pressure of about 5 mTorr to 200 Torr.

5. The method as claimed in claim 1, wherein a deposition process for the nitride spacer layer is carried out in an LPCVD chamber having a temperature of about 600 to 900° C. and pressure of about 0.1 to 10 Torr by using one of $SiH_4$, $SiCl_4$ and $SiH_2Cl_2$ gas as silicon source gas and one of $NH_3$ and $N_2$ gas as nitrogen source gas.

6. The method as claimed in claim 5, wherein a ratio of nitrogen source gas to silicon source gas is about 1:1 to 20:1 when depositing the nitride spacer layer.

* * * * *